(12) United States Patent
French et al.

(10) Patent No.: US 8,027,000 B2
(45) Date of Patent: Sep. 27, 2011

(54) COLOUR ACTIVE MATRIX DISPLAYS

(75) Inventors: Ian D. French, Hove (GB); Mark J. Childs, Swindon (GB); David A. Fish, Haywards Heath (GB); Jason R. Hector, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/829,477

(22) Filed: Jul. 2, 2010

(65) Prior Publication Data

US 2010/0265440 A1 Oct. 21, 2010

Related U.S. Application Data

(63) Continuation of application No. 11/914,248, filed as application No. PCT/IB2006/051539 on May 16, 2006, now Pat. No. 7,773,176.

(30) Foreign Application Priority Data

May 17, 2005 (EP) ..................... 05104100

(51) Int. Cl.
G02F 1/1335 (2006.01)
(52) U.S. Cl. ...................................... 349/106
(58) Field of Classification Search ............. 349/106
See application file for complete search history.

(56) References Cited

U.S. PATENT DOCUMENTS

| | | | |
|---|---|---|---|
| 5,695,690 A | 12/1997 | Swirbel et al. | |
| 5,796,451 A | 8/1998 | Kim | |
| 6,063,527 A * | 5/2000 | Nishikawa et al. | 430/7 |
| 6,143,582 A * | 11/2000 | Vu et al. | 438/30 |
| 6,630,274 B1 * | 10/2003 | Kiguchi et al. | 430/7 |
| 6,690,438 B2 | 2/2004 | Sekiguchi | |
| 2002/0027625 A1 | 3/2002 | Nishi et al. | |

(Continued)

FOREIGN PATENT DOCUMENTS

| | | |
|---|---|---|
| EP | 1122794 A2 | 8/2001 |
| GB | 2319650 A | 5/1998 |
| JP | 60102613 A | 6/1985 |
| JP | 63060427 A | 3/1988 |

(Continued)

OTHER PUBLICATIONS

S. Hofer et al, "Successful Diffusible Brachytherapy (DBT) of a Progressive Low-Grade Astrocytoma Using the Locally Injected Peptidic Vector and Somatostatin Analogue 90Y-dotao-d-phe1-tyr3-octreoticde (DOTATOC)", Swiss Medical Weekly, EMH Swiss Medical Publ., Basel, CH, vol. 131, No. 43/44, 2001, pp. 640-641, XP008004296.

*Primary Examiner* — Sung H Pak
*Assistant Examiner* — Hoang Tran (57) ABSTRACT

A method of manufacturing a color active matrix display device comprises forming islands over a rigid carrier substrate, forming a plastic substrate over the rigid carrier substrate, forming an array of pixel circuits over the plastic substrate and forming a display layer over the array of pixel circuits. The rigid carrier substrate is then released from the plastic substrate and the plastic substrate then has channels defined by the islands. These are filled to define color filter portions. The formation of a plastic substrate on a rigid carrier, with the use of a subsequent lift off process, enables the circuit arrays to be made on very thin plastic sheets. The color filters can then be made on the outside of the LC cell. Depressions are formed in the plastic substrate registered to the circuit array, and these are filled in with color filter material, for example by ink jet printing.

24 Claims, 6 Drawing Sheets

U.S. PATENT DOCUMENTS

| | | |
|---|---|---|
| 2002/0182766 A1 | 12/2002 | Yamamoto |
| 2003/0011728 A1 | 1/2003 | Battersby |
| 2003/0048256 A1* | 3/2003 | Salmon .................. 345/168 |
| 2004/0070706 A1 | 4/2004 | Freeman |
| 2005/0017255 A1 | 1/2005 | Yamazaki |
| 2005/0042797 A1 | 2/2005 | Lin |
| 2005/0046068 A1 | 3/2005 | Huang et al. |

FOREIGN PATENT DOCUMENTS

| | | |
|---|---|---|
| JP | 05027224 A | 2/1993 |
| JP | 06167608 | 6/1994 |
| JP | 2000075278 | 3/2000 |
| JP | 2003315528 | 11/2003 |
| WO | 2005050754 A1 | 6/2005 |

* cited by examiner

COLOUR ACTIVE MATRIX DISPLAYS

This is a continuation of prior application Ser. No. 11/914,248 filed Nov. 13, 2007 and is incorporated by reference herein.

This invention relates to colour active matrix display devices, and in particular relates the manufacture of such devices using plastic substrates.

The most common form of active matrix display is an active matrix liquid crystal display (AMLCD). AMLCD devices are usually made on large glass substrates that are 0.7 mm thick. Two plates are needed for a cell, so that completed displays are just over 1.4 mm thick. Mobile phone manufacturers, and some laptop computer manufacturers, require thinner and lighter displays, and completed cells can be thinned in an HF (hydrofluoric acid) solution, typically to about 0.8 mm thick. Mobile phone manufacturers ideally want the displays to be even thinner, but it has been found that cells below 0.8 mm thick made by this method are too fragile.

The HF thinning is not attractive because it is a wasteful process that uses hazardous chemicals that are difficult to dispose of safely and economically. There is also some yield loss during the etching process due to pitting of the glass.

The attractiveness of light, rugged and thin plastic AMLCDs as an alternative has long been recognised. Recently, interest in plastic displays has increased even further, partly due to the increased use of colour AMLCDs in mobile phones and PDAs. There has been much research recently into AMLCDs and organic light emitting diode (OLED) displays on plastic substrates. Despite this interest, there is still a need for a plausible manufacturing route for mass production of plastic displays.

Three main different ways have been reported for the manufacture of thin film transistors (TFTs) or displays on plastic substrates. These are making devices directly onto freestanding plastic substrates, transfer processes and sacrificial etching. Some examples of these techniques and the difficulties associated with them are discussed below.

(i) Making AMLCDs Directly Onto Plastic Substrates

This was the first approach to the fabrication of AMLCDs on plastic, and typically used low temperature polycrystalline silicon (LTPS) TFTs or amorphous silicon (a-Si) TFTs. There are many problems with this approach and it has not yet reached the manufacturing stage.

The processing temperature for TFT fabrication and cell making must be limited because plastic substrates shrink when they are heated, which makes photolithography alignment and plate coupling difficult. Preheating the substrate for many hours reduces the amount of shrinkage during processing, but does not totally eliminate it. Reduced process temperatures cause problems with the TFTs (less electrically stable a-Si TFTs, poor quality gate dielectric $SiO_2$ for LTPS TFTs).

Although several different attempts have been made by different parties for manufacturing displays on freestanding plastic substrates, the problem of substrate handling in automated factories has also not been resolved. It is impossible to use standard AMLCD factories, which rely on the mechanical strength of the glass substrates for handling, transport in cassettes and photoresist spinning. A completely new set of machines would need to be developed for every process step. It would also need a coordinated approach from many different machine manufacturers and if any one type of equipment manufacturer was not involved, or if they did not successfully develop a module, then all the work on other machines would be wasted.

Several groups have proposed roll-to-roll manufacturing, but this still has severe problems for use in vacuum equipment and for aligning layers. New printing techniques would need to be developed, and whether this could really be done for high yield processes and fine alignment is unsure.

Most freestanding plastic films have poor surface quality, in particular they tend not to be smooth and have lots of cracks on their surface. Glass substrates are mechanically hard, so that they are not scratched by gentle contacts, and they can be carried in cassettes. In these cassettes, only the edges of the glass touch the cassette, so that most of the area of the glass is never touched. In comparison, plastic substrates are soft and they are not rigid enough to be carried in cassettes. This means that they must be packed flat in contact with other layers, or they must be wound onto a roll, in which case both top and bottom surfaces will be in contact with other layers while under mechanical stress. These processes tend to damage the soft surface of the plastic. In standard AMLCD manufacturing, great care is taken to have as near perfect glass surfaces as possible, so scratched rough plastic surfaces are unlikely to be a realistic option for high yield mass production. Surfaces can be planarised and given additional protective coatings, but this adds process steps and hence cost.

(ii) Plastic Displays by Transfer Processes

A known example of this process is the so-called SUFTLA process developed by Seiko Epson Corporation. This is a double transfer process. First, Low Temperature Polycrystalline Silicon (LTPS) TFT arrays are made on amorphous silicon and silicon dioxide layers on glass. The top of the TFT array is then stuck to a plastic substrate with water-soluble glue and the TFT layers are freed from the bottom substrate by using a XeCl laser to irradiate the bottom a-Si layer through the glass.

The laser beam causes hydrogen exodiffusion, and the released hydrogen lifts the TFT array from the original glass substrate. For practical reasons, the TFT array has a standard geometry, with the top of the LTPS TFT array towards the LC material of the AMLCD. A second plastic film is laminated to the bottom of the TFT array using a permanent adhesive. The array is then released from the first plastic film by dissolving the water-soluble adhesive.

This is an expensive process due to the use of two transfer processes, and is expected to have yield problems. There may also be problems in obtaining good flat displays by laminating the TFT layers to the plastic substrates. After the TFT array has been transferred to the final plastic substrate, then cell manufacture becomes an issue. This requires two thin flexible plastic sheets to be accurately aligned together, followed by the cell coupling and filling. Problems arise in mass production due to difficulties in substrate handling and alignment.

Another transfer process which has been proposed involves forming LTPS arrays on a layer of $SiO_2$ on glass substrates. Again, a second substrate is stuck onto the TFT array with water soluble glue, but this time the glass substrate is etched away in HF. The array is then transferred to a permanent plastic substrate and the temporary substrate removed by dissolving the water soluble glue. This differs from the transfer process described above in that the TFT array is transferred onto a temporary substrate by etching the glass substrate instead of using a laser transfer process. This process may have better yield, but it is expensive and environmentally wasteful due to the complete etching of the entire glass substrate.

One major advantage of these transfer techniques is that the TFTs are not made on the final plastic substrates so that high temperature processing can be used. Also, there are no problems with substrate shrinkage, which is one of the main problems of TFT fabrication on freestanding plastic substrates, as described above.

(ii) Plastic Displays by Sacrificial Etching

Another proposal has been the use of an a-Si sacrificial layer over a rigid substrate, with subsequent spinning on of a plastic layer. Poly-silicon TFTs are made on top of the plastic layer and etch holes are made through the plastic layer and the array. The substrate is then immersed in a liquid etch which passes through the etch holes and dissolves the a-Si sacrificial layer, allowing the plastic layer and TFTs to float off. This process is not suitable for making displays because of the etch holes that pepper the array.

The Applicant has proposed (but not yet published) an alternative approach in which a substrate arrangement is manufactured comprising a rigid carrier substrate and a plastic substrate over the rigid carrier substrate. The rigid carrier substrate is released from the plastic substrate after forming pixel circuits and display cells over the plastic substrate. This enables substantially conventional substrate handling, processing and cell making to be employed.

A release process comprising a laser lift-off process has been proposed for releasing the rigid carrier substrate from the plastic substrate.

The invention relates particularly to a method of integrating the colour filters onto the active plate of the liquid crystal display, and involves the use of the proposed plastic substrate technology for this integration.

The integration of colour filters onto the active plate of AMLCDs has been recognised as an attractive proposition, as this can increase optical aperture, compared to standard colour filters, because the alignment on the plate is much better.

There are two different forms of pattern alignment used in AMLCD manufacture. The first is photolithographic alignment, which is used to build up patterns of different metals, dielectrics and semiconductor layers on the substrate. The technique is highly accurate, and for AMLCD manufacturing it is usually quoted as having an alignment accuracy of approximately 2 µm on substrates that are now getting close to 2×2 m in size. In fact, the alignment accuracy is usually better than 1 µm.

The second kind of alignment is plate-to-plate coupling. This aligns the two sides of the LC cell together. For an AMLCD there is typically an active matrix array on one plate and colour filters, black mask and ITO on the other.

Figure 1:
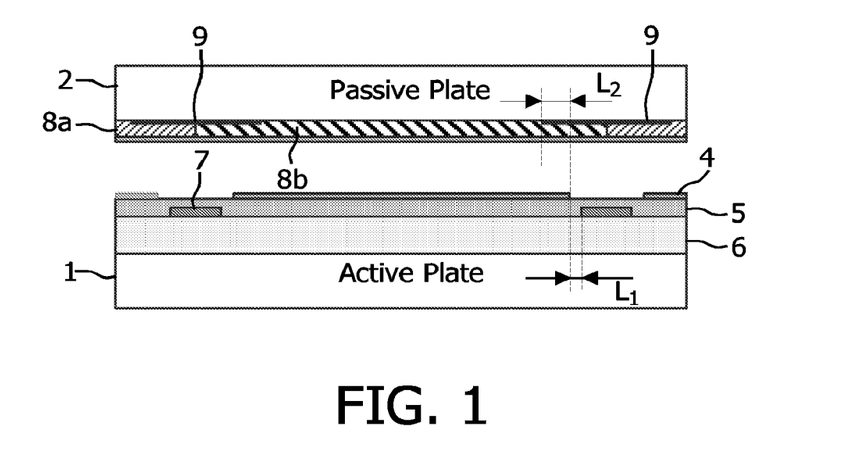
FIG. 1 shows a conventional liquid crystal display in cross section.

FIG. 1 shows a cross-section through the middle of the pixel of a typical active matrix liquid crystal display.

The display comprises an active plate 1 and a passive plate 2. The active plate 1 is formed over a glass substrate 3, typically 0.7 mm thick, and carries thin film pixel circuits, with ITO pixel electrodes 4 on the uppermost surface which overlie a SiN passivation layer 5. Only some of the layers are shown in FIG. 1, and including the SiN gate insulator layer 6 and column conductor layer 7.

The passive plate 2 carries colour filters 8a, 8b, and a black mask layer 9 which shields the part of the pixel where there is no pixel electrode. As shown, an overlap is required ($L_2$) of the black mask layer 9 over the pixel electrodes, and there is also a spacing ($L_1$) between the column conductors 7 and the pixel electrodes 4. The spacing $L_1$ must be greater than about 1 µm to prevent capacitive cross-coupling. $L_1$ takes into account the maximum photolithographic alignment error and $L_2$ takes into account the maximum plate misalignment.

In so-called "high aperture" designs, the pixel electrodes 4 can overlap the column electrodes 7, so that the black mask size is dictated only by the dimension $L_2$.

However, the plate to plate alignment tolerances (which are included in $L_2$) are much larger than photolithographic alignment. For example, there can be some movement during contacting and while the seal lines are being cured, so plate to plate coupling accuracy is closer to 10 µm. For high quality displays, it is crucial that light can only pass through the pixel ITO, where it is modulated to give the desired light transmission level.

Any light that can pass round the pixel and reach the viewer will lower contrast ratio and mean that the black state is not as black as it could be. This degrades display performance.

The black mask layer reduces the optical aperture of the display. Maximising optical aperture is important for maximising brightness of the displays and reducing power consumption, and this plate to plate coupling accuracy can effectively be the factor that limits these parameters.

It has been recognised that one way to improve the optical aperture is to move the colour filter to the active plate. This can be done in one of two ways for glass substrates. Both have been demonstrated in research, but are not used in mass production.

The first method is to put the colour filter beneath the TFT array. It has been reported that this can increase the optical aperture of a 15" XGA monitor from about 60% to 80%. The colour filter is normally made of dyed polymers that are 1 to 2 µm thick and they give a very uneven profile. There are severe practical difficulties with processing the TFTs on these uneven surfaces, but the main problem for this process is processing temperature. The colour filters must not be heated above about 150° C. or they start to degrade and lose their colour saturation. The TFTs are normally deposited above 300° C. This temperature can be lowered to close to 200° C., but if it goes below 200° C. then the TFTs become too electrically unstable for an acceptable display lifetime. Having poor colour saturation or unstable TFTs is not acceptable.

The second technique is to have colour filters above the TFT array. The simplest way to do this is to simply put a colour filter on top of a standard TFT array. This is not practical because placing a thick polymer layer over the pixel electrode significantly increases the driving voltage and introduces image retention due to charge motion in the polymer. It is possible to make the TFT array, deposit the colour filters, then put the ITO above the colour filters with electrical connection through the colour filter layer. This is a difficult process to control requiring good tapered slopes on all the colour filter layers, high quality ITO with limited temperature for the deposition and accurate and reliable patterning of ITO on top of bumpy polymer layers. This process does not appear to have made it to the manufacturing stage.

A second major advantage of integrating the colour filters into the active plate is that the passive plate does not then need to be accurately aligned to the active plate. This makes the cell making process much simpler and would not need such expensive plate coupling equipment.

Despite the recognised benefits of integrating colour filters into the active plate of an LCD, no solution has been found providing a low cost and reliable implementation of such a display architecture.

According to the invention, there is provided a method of manufacturing a colour active matrix display device, comprising:

forming islands over a rigid carrier substrate;
forming a plastic substrate over the rigid carrier substrate;
forming an array of pixel circuits over the plastic substrate;
forming a display layer over the array of pixel circuits;

releasing the rigid carrier substrate from the plastic substrate after forming the display layer, the plastic substrate having channels defined by the islands; and filling the channels to define colour filter portions.

The formation of a plastic substrate on a rigid carrier, with the use of a subsequent lift off process, enables the circuit arrays to be made on very thin plastic sheets. The colour filters can then be made on the outside of the LC cell. Depressions are formed in the plastic substrate registered to the circuit array, and these are filled in with colour filter material, for example by ink jet printing.

The method may further comprise manufacturing a second substrate arrangement, and wherein forming a display layer over the array of pixel circuits comprises mounting the first and second substrate arrangements with electro-optic material sandwiched therebetween, the active matrix display device thereby comprising first and second substrates with the electro-optic material sandwiched therebetween.

The second substrate arrangement can also be arranged as a second rigid carrier substrate, and a second plastic substrate over the second rigid carrier substrate. One or both of the rigid carrier substrates can be a glass substrate.

The invention also provides a colour display device, comprising:

a plastic substrate;

an array of thin film pixel circuits deposited over the plastic substrate;

a display layer over the array of pixel circuits; and an array of colour filter portions provided in channels on the opposite side of the plastic substrate to the array of thin film pixel circuits, the channels being defined by a support structure which supports the plastic substrate during the deposition of the thin film pixel circuits, and which is removed to enable provision of the colour filter portions.

Examples of the invention will now be described in detail with reference to the accompanying drawings, in which.

Figure 2:
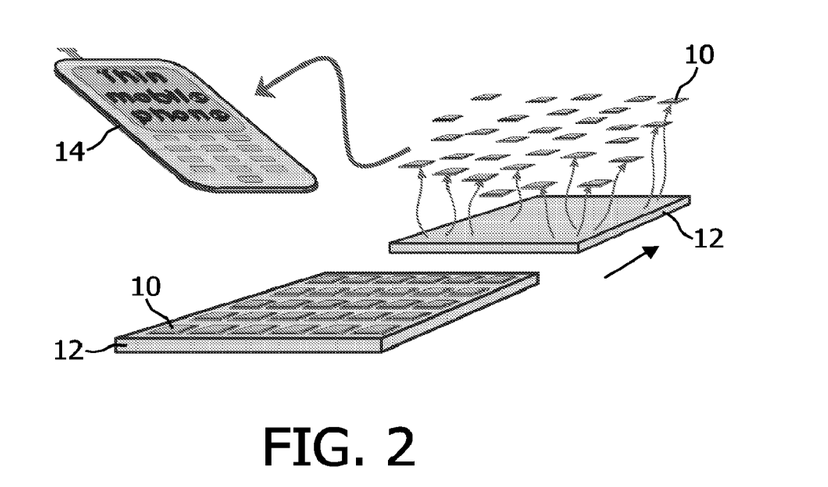
FIG. 2 shows manufactured displays (made using a method proposed by the applicant and utilized in this invention) being released from a common glass substrate for use in a mobile phone.

FIG. 2 shows schematically the fabrication of plastic displays as proposed (and not yet published) by the Applicant, and shows the final release stage. Completed displays 10 are released from a glass substrate 12 and are then used in devices such as a mobile phone 14.

Figure 3:
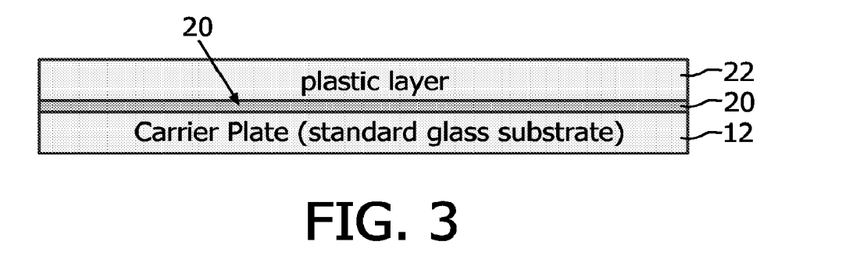
FIG. 3 is used to explain briefly the release process shown in FIG. 2.

FIG. 3 is used to explain the basic manufacturing concept, and shows a glass carrier plate 12 with an a-Si release layer 20 and a plastic layer 22 which functions as a plastic substrate. This substrate configuration can form the basis of the active plate and the passive plate. FIG. 3 shows only one display substrate, but in practice there would be many displays on large glass substrates, as shown in FIG. 2.

The release layer 20 may be a thin layer of a-Si, and is deposited onto the glass substrate 12 before the plastic layer 22 is added. An a-Si release layer is for example applied by PECVD and can be from 10 to 50 nm thick. A laser release process can be used to activate the release layer and separate the plastic substrate from the glass carrier.

The process above enables a freestanding plastic layer to be formed with amorphous silicon TFTs on plastic layers as thin as 3.5 μm, which have been freed from a glass substrate. The TFT electrical characteristics are identical to TFTs on glass.

The plastic layer must be strong enough to be one of the walls of the completed cell. Suitable plastic layers could be colourless polyimides, polyethylene napthalate (PEN), polyethersulfone (PES), benzocyclobutene (BCB), silicone, or other plastic layers. The thickness of the plastic layer is a compromise between small thickness for low cost and ease of fabrication and thicker layers to give strength. It will normally lie within the range 4 to 50 μm. The release layer 20 may be a thin layer of a-Si, and is deposited onto the glass substrate 12 before the plastic layer 22 is added. This release layer 20 may not be needed, depending on the release process to be employed.

An a-Si release layer can be applied by PECVD and can be from 10 to 50 nm thick.

In one example, the plastic layer is spin coated. This gives an extremely high quality surface and can give an extremely thin layer if required. Most importantly, the plastic is capable of wet casting. The plastic can thus instead be applied by spreading with a blade or printing techniques such as offset litho or silk screen printing. In a further example, the plastic layer is parylene, and the parylene deposition process is used.

This invention relates to the replacement of the glass substrate for the TFT array with a very thin plastic sheet, using a process as outlined above, and the deposition of the colour filters on the outside of the LC cell. This approach is not appropriate for normal glass displays because the glass plates for AMLCD manufacturing are of the order of 0.7 mm thick, although this can be reduced to approximately 0.3 mm by etching the glass of the completed cell. However, the pixels are of the order of 50 to 100 μm wide, so that even if the glass substrate is 0.3 mm thick, the colour filter would only be in line with the LC pixel from a very small range of viewing positions.

The small substrate thickness enabled by the process described above makes the positioning of the colour filter layers on the opposite side of the substrate to the pixel circuits a practical proposition, and this invention provides a manufacturing method for this purpose, as well as the resulting display configuration.

Figure 4:
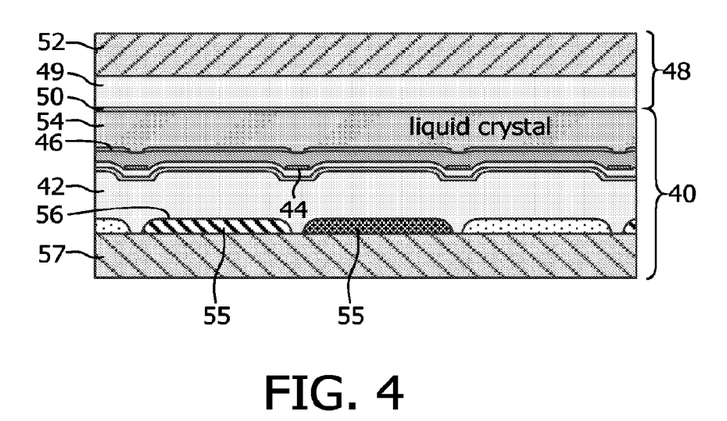
FIG. 4 shows in cross section a display device of the invention.
Figure 5:
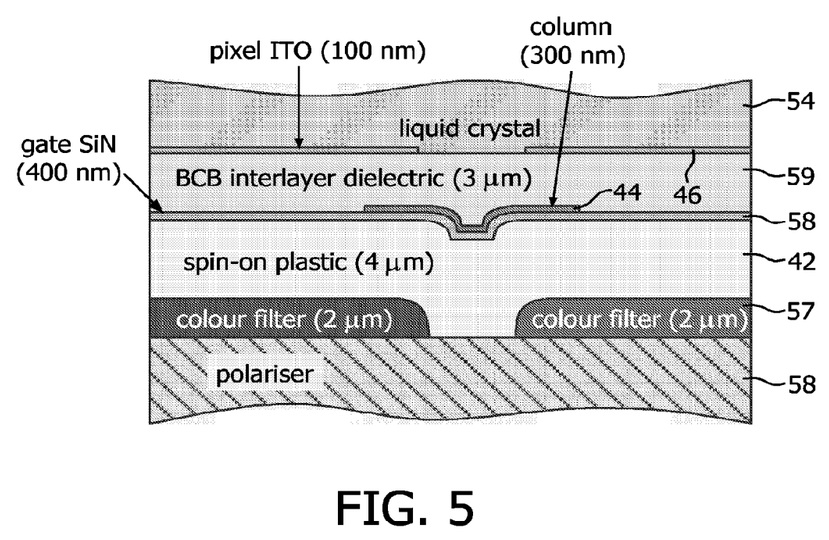
FIG. 5 shows the some of the layers of FIG. 4 in more detail.

FIG. 4 shows a display device of the invention, and FIG. 5 shows in more detail the active plate in the region of one of the column lines.

The active plate 40 has a plastic substrate 42. On one side is provided the array of thin film pixel circuits. The column electrodes 44 are shown, as well as the patterned ITO pixel electrodes on top of the pixel circuits. In the example shown in FIG. 4, the passive plate 48 also has a plastic substrate 49, and this is covered in the non-patterned common electrode 50. The passive plate is provided with a polariser 52.

An LC display layer 54 is sandwiched between the active and passive plates.

In accordance with the invention, an array of colour filter portions 55 are provided in channels 56 on the opposite side of the plastic substrate 42 to the array of thin film pixel circuits. These colour filter portions fill the channels so that they define a substantially planar bottom surface to the plastic substrate 42. A polariser 57 is provided over the side of the plastic substrate 42 with the colour filters.

FIG. 5 shows the typical dimensions for the different layers of the structure. The thickness of the plastic substrate 42 is preferably less than 50 µm, and an example of 4 µm is shown. The colour filter portions 57 are recessed into channels which are approximately 2 µm deep. FIG. 5 also shows the gate insulator layer 58 (400 nm of SiN) and a palanarizing dielectric layer 59 (3 µm of BCB) on which the pixel electrodes 46 (100 nm of ITO) are formed.

One example of the method proposed by the Applicant will now be described in detail, and in which a display is made using laser release from a glass substrate, and with ink jet printing for the colour filters of the display. The example shown in detail is for the manufacture of liquid crystal display cells, having LC material sandwiched between two opposite (active and passive) substrates. The method can be applied to other backlit display technologies, and the specific example is for illustration only. The method of manufacturing the device of FIGS. 4 and 5 will be described with reference to FIG. 6.

Figure 6A:
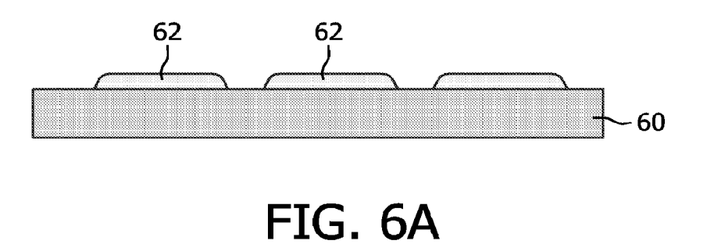
FIGS. 6A to 6I show the processing steps for one example of method of the invention.

FIG. 6A shows the glass substrate 60 on which the display active plates are to be processed. Islands 62 are formed on the substrate, for example $SiO_2$ or SiN islands. These will define channels in the plastic substrate for receiving the colour filters.

Figure 6B:
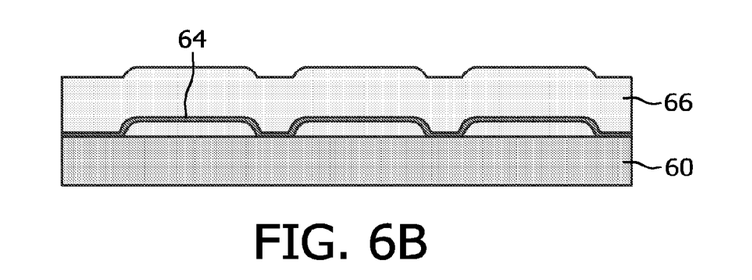

FIG. 6B shows an a-Si release layer 64 deposited on the substrate and the plastic layer 66 that is applied, for example using a spin-on process. The plastic layer is to form the active plate of the final display. The plastic layer is a low birefringence material, such as BCB or epoxy. The release layer may not be necessary, but it increases the process window for the release process.

Figure 6C:
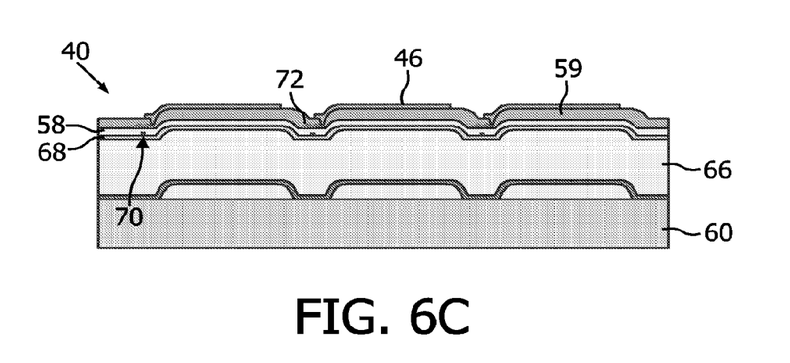

FIG. 6C shows the a-Si TFT arrays having been made on the plastic surface using (almost) standard processing. The maximum processing temperature will depend upon the plastic layer chosen, but it could be higher than for freestanding plastic films because the plastic is securely anchored to the rigid glass substrate 12 and there are no problems with shrinkage.

In one example, the TFT array is provided over a SiN layer 68, and the TFTs comprises a gate metal layer 70, the silicon nitride gate dielectric layer 58, the dielectric layer 59 and the ITO pixel electrodes 46. The TFTs are shows schematically as 72. This example uses a-Si BCE TFTs with a SiN layer beneath the TFTs. The TFTs could equally well be top gate or bottom gate, a-Si or poly-Si TFTs.

Figure 6D:
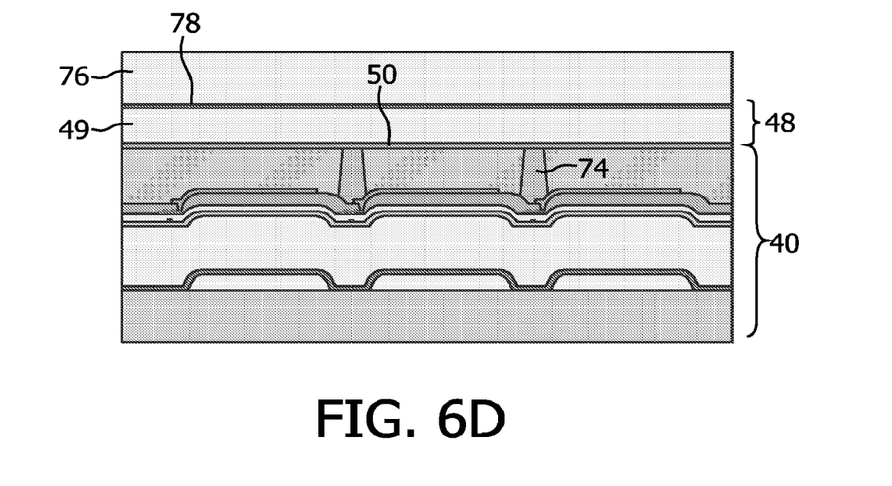

FIG. 6D shows the structure after LC cell formation, including the addition of column spacers 74 for the LC cell. These could either be made by inkjet printing or spinning on a suitable polymer layer and then patterning by photolithography. Dispersed glass or plastic beads or rods could also be used instead, but column spacers that stick to both substrates can give plastic cells increased mechanical strength and help protect the cell from separating.

FIG. 6D also shows the passive plate 48 supported on its own glass substrate 76 and release layer 78, and comprising a plastic layer 49 with a sheet ITO electrode 50. The plastic substrate 49 of the passive plate may use the same plastic as used for the active plate or it may be a different plastic.

Figure 6E:
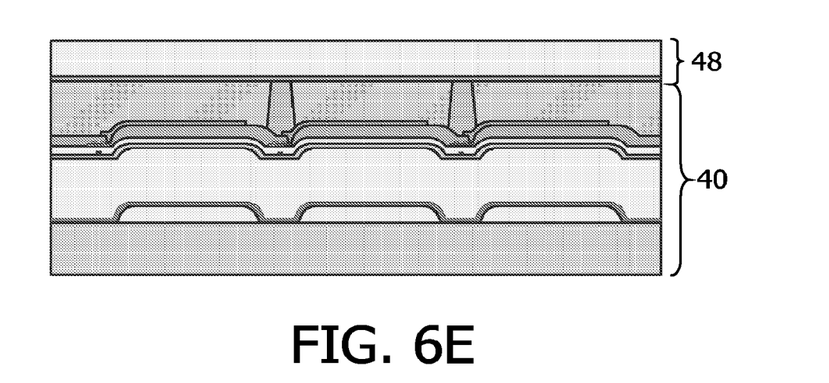

FIG. 6E shows the structure after the removal of the glass supporting substrate of the passive plate, using a laser release process as described above.

Figure 6F:
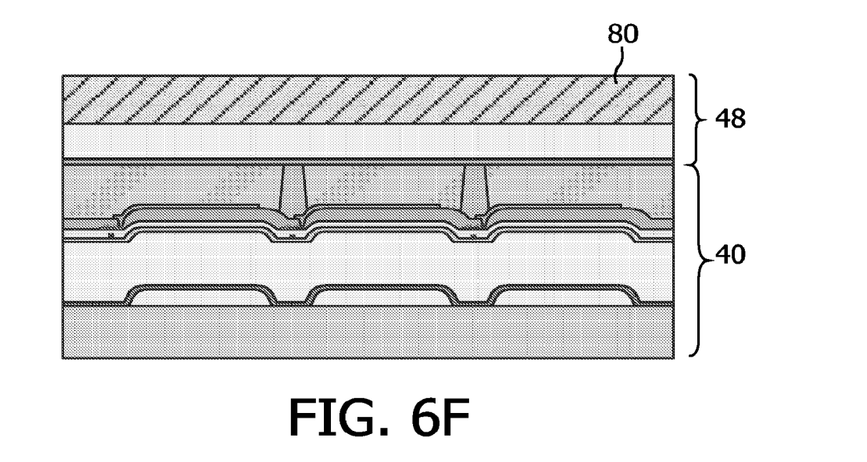

FIG. 6F shows a polariser 80 added to top plate. This gives the final display additional strength and rigidity. A chip-on-glass process or foil bonding can also take place at this time, with the advantage that the plastic sheet is still firmly stuck to the glass, simplifying alignment and fixing. The advantage of applying the polariser at this stage, before final release of the display, is also that the display still has rigidity due to its coupling to the glass. The polariser also gives added strength to the top plastic layer.

Figure 6G:
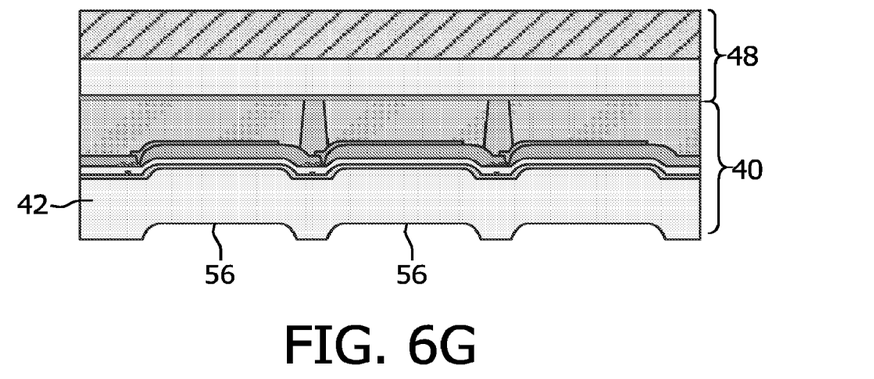

FIG. 6G shows the structure after the removal of the glass supporting substrate of the active plate, again using a laser release process as described above. This leaves the underside of the plastic substrate 42 with the channels 56 for receiving the colour filters.

Figure 6H:
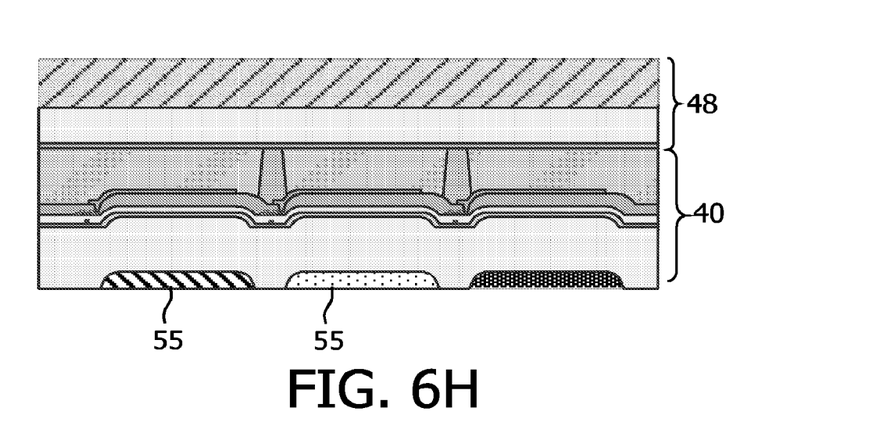

As shown in FIG. 6H, the colour filters 55 are then added, preferably by an ink jet process. The plastic may have needed a plasma or wet process to make the plastic hydrophilic, for instance by fluorinating the surface. In FIG. 6H, the polymer colour filters are shown perfectly flat and in line with the bottom plastic substrate. In practice, the colour filter material will probably lie above or below the plastic surface and an additional planarisation layer can also be used if required.

Figure 6I:
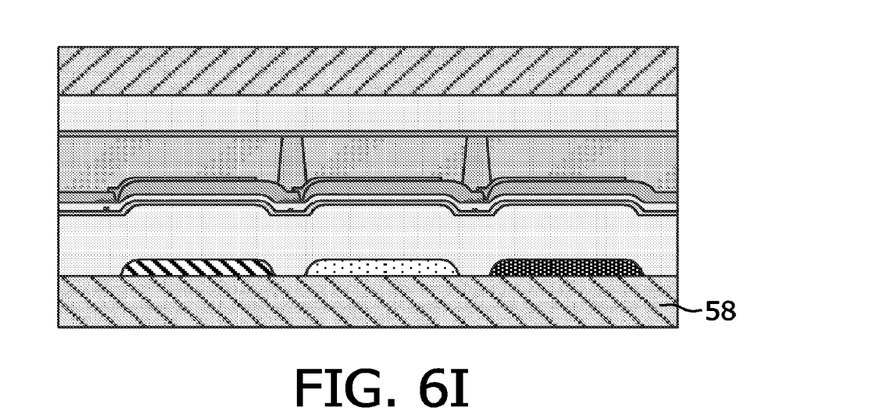

FIG. 6I shows the addition of the second polariser 58 to the active plate. The active plate polariser must be applied display by display in this case.

In the example above, the LC cell formation has not been described in detail. Different processes may be used, depending on whether traditional cell making is used, or the newer Vacuum Alignment with Liquid Crystal (VALC) method, sometimes called drop filling. In this drop filling method, LC droplets are put onto one of the plates before alignment and plate coupling is carried out under vacuum.

The glass carrier plates can be cleaned to remove all traces of residues from and can then be reused.

A laser release process has been mentioned above. There are in practice at least three ways that the plastic substrates can be released from the glass substrate. Methods that can be used are laser release from plastic that is directly in contact with the glass substrate, laser release using a silicon release layer between the glass and plastic, and lamp heating with a silicon release layer. These are each discussed below.

(i) Laser Release Directly from a Glass Substrate

A method has been disclosed in which laser irradiation (XeCl) is used through quartz carriers to release polyimide layers to form metal-polyimide circuits. A thin layer, <1 µm, is photo-ablated leaving freestanding polyimide films with good mechanical integrity. A similar process has been used in MEMS fabrication, but this time the polyimide is used as a sacrificial layer, which is dissolved after the laser release process. In principle this is an ideal process for making plastic display because it does not require any additional release layers to be deposited or spun.

(ii) Laser Release Using an a-Si Release Layer

Figure 7:
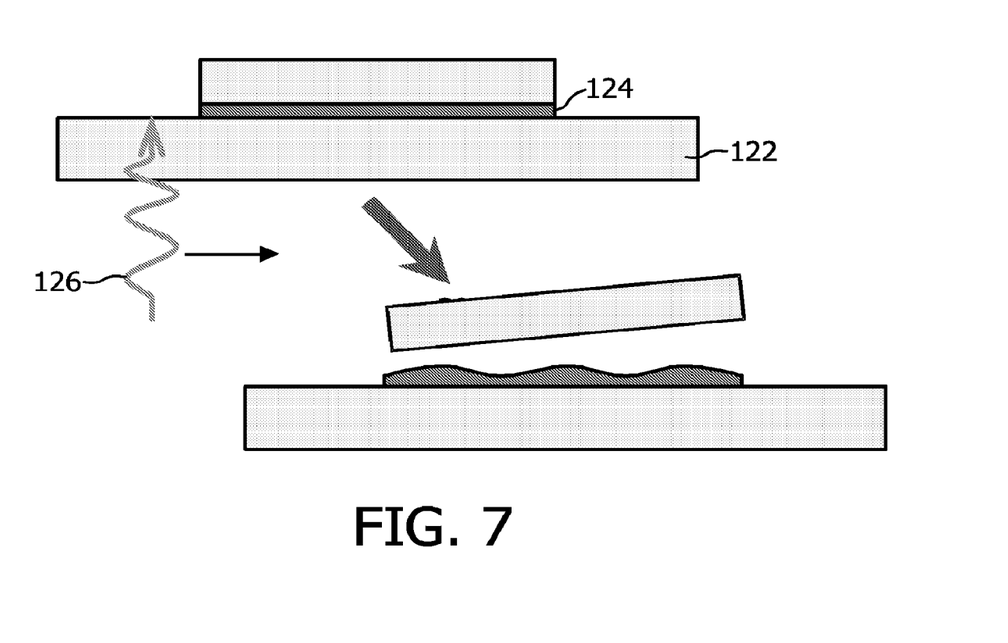
FIG. 7 shown the release process parameters in more detail.

The second method is to use the laser release process with an a-Si release layer, as used in the so-called SUFTLA process. FIG. 7 shows a 20 µm polyimide plastic substrate 120 attached to a glass carrier 122 using a 40 nm a-Si release layer 124, which is made by Plasma Enhanced Chemical Vapour Deposition (PECVD).

The polyimide 120 is dry etched using a metal masking layer. The a-Si release layer 122 is also dry etched to leave a bare substrate around the polyimide island. Scanning a XeCl laser line beam 126 across the bottom of the glass causes the a-Si to melt and hydrogen to be released. The polyimide is then cleanly released from the surface of the glass.

(iii) Release Using an a-Si Release Layer and Lamp or Hotplate Heating

As an alternative to laser irradiation of an a-Si release layer the a-Si can be rapidly heated by lamps designed for Rapid Thermal Processing (RTP), or by lowering the samples onto a hotplate.

The laser release examples above refer to the use of a polyimide plastic substrate, and the use of polyimide as a plastic substrate for electronic devices has been proposed in the past. This is very strong and has good mechanical properties after release, but it has strong birefringence. This means that it is suitable as a substrate for reflective and emissive displays and sensors, but less suitable for transmissive LCDs.

There is therefore a desire for an alternative plastic layer. Some of the plastics that have been used for display substrates can only be made by thermal extrusion, such as polyethylene napthalate (PEN), polyethersulfone (PES) and polyethylene terephthalate (PET). There is no simple way of applying these as thin films to glass substrates.

One preferred alternative plastic material for the substrate is parylene, and a laser release process is appropriate for this plastic material.

Parylene is widely used as a coating layer for surgical tools (such as catheters), surgical implants (such as artificial hips and heart valves) and coatings for high specification circuit boards and aerospace components.

Parylene is deposited by a three-stage vacuum process in three different vacuum chambers, rather than being thermally extruded or applied as a liquid. The three deposition steps are:

(i) Sublimation of the solid dimer at approximately 150° C. in chamber A.

(ii) The dimer then passes through a vacuum furnace (chamber B) at about 680° C. where it is cracked by pyrolosis to form a stable monomer.

(iii) The monomer then passes into the deposition chamber C where it is simultaneously absorbed and polymerised on the substrate surface.

The substrate is at room temperature during deposition, so no stress is built into the layers during cooling, which is a feature of all elevated temperature deposition processes.

Other notable features of parylene are:

(i) It has near perfect conformal coating and, due to the low-pressure deposition process used, it can fill in small spaces. It is considered to be a completely pinhole free barrier coating.

(ii) It has good chemical resistance, is insoluble in common solvents and resists attack from exposure to acids and bases.

(iii) It is highly transparent. In particular, it has substantially the same transparency as 1737 glass over approximately the same spectral range.

(iv) It has a high dielectric strength (>5 MV/cm) and dielectric constant of 2.65.

(v) It has excellent barrier properties to gas and liquids. This is potentially extremely important for LC cells, where it is important that moisture and ionic contaminants do not pass into the LC material.

(vi) Parylene has good mechanical properties as a self-supporting membrane. This is demonstrated by its known use in micro electromechanical switches (MEMS), for instance as self-supporting structures and membranes for valves and loudspeakers.

Thermal endurance is one of the biggest issues for plastic substrates. Parylene is quoted as having 100 000 Hrs endurance at 106° C. in air and greater than 100 000 Hrs endurance at 200° C. in inert atmospheres. Parylene C is the most common form of parylene (the other forms being parylene D and parylene N) and is the preferred option for this application, and has a melting temperature of 280° C. The maximum processing temperature of parylene is therefore in the range of 220 to 260° C.

An example of the experimental use of parylene as the substrate material to demonstrate the release process explained above will now be explained.

An amorphous silicon release process was used, and for this purpose the 20 nm of hydrogenated a-Si:H was deposited onto glass substrates at 300° C. The a-Si:H used contains approximately 7 atomic % hydrogen.

A 10 µm coating of parylene C was then deposited.

Figure 8:
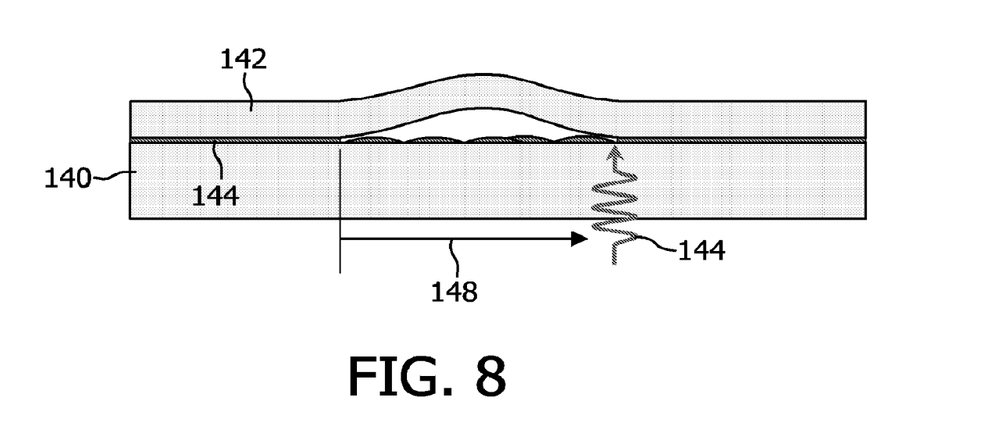
FIG. 8 shows another example of laser release process used in the method of the invention.

A laser release process with a scanning XeCl excimer laser was employed, as shown in FIG. 8.

FIG. 8 shows the glass substrate 140, the 10 µm parylene plastic substrate 142 and a 20 nm a-Si release layer 144.

The laser, providing an XeCl laser beam 146 was directed through the back of the glass substrate 140, and the a-Si:H layer 144 very strongly absorbs the blue laser light at 308 nm. The fluence of the laser was adjusted so that it just melted the a-Si:H.

On melting, the a-Si:H balls up and releases hydrogen. The combination of a-Si:H melting and hydrogen release lifts the parylene away from the glass substrate.

In experiments performed, a pulsed laser was used, and the exposure area was moved along in steps (arrow 148) to implement the parylene lift-off process. The XeCl laser was pulsed and irradiated an area of approximately 20×0.5 mm with each flash. After each exposure, the laser was moved by 0.4 mm to give a series of overlapping lines.

However, any process that melts the a-Si:H by irradiation could be employed, including large area single pulses of laser and also strong lamp annealing.

These experiments demonstrated that the parylene layer can be easily removed from the plastic substrate, and has good mechanical properties so that it can be picked up and rolled.

The parylene had high optical transmission, similar to the Corning 1737 glass alone, which is the standard glass used in the AMLCD industry.

The released parylene film was also placed between cross polarisers on a light box in order to determine the suitability for use in display applications using polarisers, and the performance was compared with a polyimide film. In this arrangement, the parylene absorbs substantially all light while significant amounts are transmitted through the polyimide. It is known that polyimide has high birefringence, which causes the polarised light to be rotated by different amounts and leads to the loss of light extinction. The high extinction of the parylene film demonstrates its suitability for use as a substrate material for LCDs.

Parylene is very lubricious, which could mean that it is difficult to get other thin films to adhere to it for making TFTs and displays. This can usually be solved for plastic substrates by exposing the surface to an Ar plasma before depositing the other layers. Other pre-treatment operations may be carried out, for example a multi-molecular layer of an organo-silane may be applied to function as an adhesion promoter.

The glass substrate may be cleaned before the parylene deposition process so that surface contaminants such as oils and ions are removed prior to the coating process. Conventional solvents can be used to perform the cleaning process.

The examples above use spin coating or the parylene process for forming the plastic substrate. Other suitable wet casting processes include printing and spreading.

The substrate can be either a standard glass substrate or a glass substrate coated with a blue-light absorbing layer. The choice depends on the plastic used and laser release properties.

A passivation layer will normally be desired, applied above the plastic layer. Suitable layer types are silicon nitride or silicon oxide deposited by Plasma Enhanced Chemical Vapour deposition (PECVD) or sputtering.

The TFT array fabrication can be carried out under fairly standard array processing conditions for a-Si or Low Temperature Poly-Si (LTPS) TFTs. There may have to be some small process changes to ensure that the deposited layers do not have high mechanical stress. The use of standard glass substrates coated with very thin layers of plastic and standard TFT array processing means that this process can be used in existing TFT fabrication plants.

TFTs can be used as the active device element for multiplexing several different display types, not only the LCD example above. Whatever the display type is, the display is fabricated while the TFT array is still stuck onto the glass. This means that standard display fabrication tools and techniques can be used and the presence of a thin layer of plastic will not cause any significant differences. The display drivers can also be bonded to the display at this time.

The plastic layer is then removed from the glass substrate, in one example by shining a blue laser through the glass substrate to hit the bottom of the plastic (or the blue-light absorbing layer). The laser for this purpose will normally have to be scanned to cover the complete area of the display. Pulsed excimer lasers with wavelengths of 308 nm and 351 nm can successfully be used to remove yellow polyimide layers from glass, and by providing amorphous silicon underneath a plastic layer, polyimide, BCB, silicones and parylene can successfully be released from the glass.

Any yellow plastic, such as polyimide, can be directly laser released by absorption of UV laser light through the glass substrate. Generally yellow substrates can only be used with emissive or reflective displays, for instance reflective LCD, electrophoretic displays (E-Ink) or upward emitting emissive displays, such as OLED or AMPLED.

Clear plastics (such as BCB, silicones and parylene) that do not absorb UV laser light need an underlying absorption/release layer, such as the amorphous silicon layer mentioned above. However, suitable absorption or release layers include not only amorphous silicon, but also Cr or possibly yellow plastics, such as polyimide.

Clear plastics can be used with all display types, including transmissive and transflective LCDs and downward emitting OLEDS and PLEDs.

Release layers, such as a-Si, can also be used under yellow plastics to increase process window, reduce any damage to the plastic layer and make sure that there are no plastic residues on the glass. Hydrogen from the amorphous silicon also lifts the polymer layer away from the underlying substrate, which can make the release process more reliable.

As mentioned above, a liquid crystal display is only one example of display technology which can benefit from the invention. For example, the invention may be applied to a polymer LED downwardly emitting display device. The invention may find application in OLED (organic LED), PLED (polymer LED), EL (electroluminescent) and PDLC (polymer dispersed LC) displays, as well as LCDs. In particular, the invention is of interest for transmissive, downward emitting or reflective displays where the light is incident on the bottom substrate.

On example of reflective display is an electrophoretic display, but there are also MEM based technologies, for example using interferometric modulation. This type of display can be made colour by having multiple cavity thicknesses, but instead a single cavity thickness can be used (giving black and white reflective operation) in conjunction with the colour filter design of this invention.

Various other modifications will be apparent to those skilled in the art.

The invention claimed is:

1. A method of manufacturing a color active matrix display device, the method comprising acts of:
   providing a rigid carrier substrate having a plurality of islands separated from each other by a separating space;
   covering the rigid carrier substrate including the islands and the separating space with a plastic substrate having a substantially uniform thickness for maintaining outlines of the islands and the separating space;
   forming an array of pixel circuits substantially over portions of the plastic substrate covering the islands and portions covering the separating space;
   forming a display layer over the array of pixel circuits;
   releasing the rigid carrier substrate and its islands from the plastic substrate after forming the display layer, the outlines of the islands forming channels in the plastic substrate; and
   filling the channels with color filter portions to define an array of color filter portions.

2. The method as claimed in claim 1, wherein filling the channels comprises printing of color filter portions into the channels.

3. The method as claimed in claim 2, wherein the printing comprises ink jet printing.

4. The method as claimed in claim 1, wherein the rigid carrier substrate comprises a glass substrate.

5. The method as claimed in claim 1, further comprising an act of forming a release layer between the plastic substrate and the rigid carrier substrate.

6. The method as claimed in claim 1, wherein each pixel circuit comprises at least a thin film transistor.

7. The method as claimed in claim 6, wherein each thin film transistor comprises an amorphous silicon TFT.

8. The method as claimed in claim 1, wherein the releasing is performed by a laser lift-off process.

9. The method as claimed in claim 1, further comprising an act of adding a polarizer to the plastic substrate.

10. The method as claimed in claim 1, further comprising an act of providing a second substrate arrangement, and
    wherein forming a display layer over the array of pixel circuits comprises an act of mounting the first and second substrate arrangements with electro-optic material sandwiched therebetween.

11. The method as claimed in claim 10, wherein the second substrate arrangement comprises a second rigid carrier substrate, and a second plastic substrate over the second rigid carrier substrate.

12. The method as claimed in claim 11, wherein the second rigid carrier substrate comprises a glass substrate.

13. The method as claimed in claim 11, further comprising a second release layer between the second plastic substrate and the second rigid carrier substrate.

14. The method as claimed in claim 11, further comprising an act of releasing the second rigid carrier substrate from the second plastic substrate.

15. The method as claimed in claim 14, wherein the releasing of the second rigid carrier substrate from the second plastic substrate is performed by a laser lift-off process.

16. The method as claimed in claim 14, further comprising an act of adding a polarizer to the second plastic substrate.

17. The method as claimed in claim 10, wherein providing the second substrate arrangement further comprises an act of providing a top conductive layer.

18. The method as claimed in claim 17, wherein the top conductive layer comprises an ITO layer.

19. The method as claimed in claim 1, wherein covering comprises applying a plastic coating to a rigid carrier substrate using a spin-on process.

20. The method as claimed in claim 1, wherein the plastic substrate comprises parylene.

21. A color display device, comprising:
- a rigid carrier substrate having a plurality of islands separated by space;
- a plastic substrate having a substantially uniform thickness for covering the rigid carrier substrate including the islands and the separating space and for maintaining outlines of the islands and the separating space;
- an array of thin film pixel circuits deposited over portions of the plastic substrate covering the islands and portions covering the separating space;
- a display layer over the array of pixel circuits;
- channels formed by the outlines in the plastic substrate when the rigid carrier substrate is released; and
- an array of color filter portions provided in the channels on the opposite side of the plastic substrate to the array of thin film pixel circuits.

22. The device as claimed in claim 21, wherein the maximum thickness of the plastic substrate is less than 50 μm.

23. The device as claimed in claim 21, further comprising an act of forming a second substrate arrangement, and wherein the display layer comprises electro-optic material sandwiched between the first and second substrates.

24. The device as claimed in claim 23, wherein the electro-optic material comprises LC material.

* * * * *